United States Patent [19]
Nakamura

[11] Patent Number: 5,290,393
[45] Date of Patent: Mar. 1, 1994

[54] CRYSTAL GROWTH METHOD FOR GALLIUM NITRIDE-BASED COMPOUND SEMICONDUCTOR

[75] Inventor: Shuji Nakamura, Anan, Japan

[73] Assignee: Nichia Kagaku Kogyo K.K., Tokushima, Japan

[21] Appl. No.: 826,997

[22] Filed: Jan. 28, 1992

[30] Foreign Application Priority Data

| | | | |
|---|---|---|---|
| Jan. 31, 1991 | [JP] | Japan | 3-032259 |
| Mar. 27, 1991 | [JP] | Japan | 3-089840 |
| Mar. 27, 1991 | [JP] | Japan | 3-089841 |

[51] Int. Cl.$^5$ ............................................. C30B 25/22
[52] U.S. Cl. ................................. 156/613; 156/610; 156/614; 437/127; 437/133
[58] Field of Search ....... 156/610, 613, 614, DIG. 61, 156/DIG. 70, DIG. 99; 437/127, 133

[56] References Cited

U.S. PATENT DOCUMENTS

| | | | |
|---|---|---|---|
| 3,683,240 | 8/1972 | Parkove | 437/905 |
| 3,829,556 | 8/1974 | Logan et al. | 156/DIG. 99 |
| 4,153,905 | 5/1979 | Charmakadze et al. | 148/DIG. 150 |
| 4,473,938 | 10/1984 | Kobayashi et al. | 156/DIG. 99 |
| 4,476,620 | 10/1984 | Ohki et al. | 437/127 |
| 4,855,249 | 8/1989 | Akasaki et al. | 437/133 |
| 4,911,102 | 3/1990 | Manabe et al. | 118/719 |
| 5,122,845 | 6/1992 | Manabe et al. | 252/62.36 A |

FOREIGN PATENT DOCUMENTS

| | | |
|---|---|---|
| 3802732A1 | 8/1988 | Fed. Rep. of Germany . |
| 4006449 | 9/1990 | Fed. Rep. of Germany . |
| 64-30110 | 2/1989 | Japan . |

OTHER PUBLICATIONS

Japanese Journal of Applied Physics vol. 28, No. 12, Dec., 1989 pp. L2112-L2114.
Journal of Crystal Growth 98 (1989) 209-219.
Solid State Communications, vol. 60, No. 6, pp. 509-512, 1886.
Appl. Phys. Lett. 48(5), 3 Feb. 1986, pp. 353-355.
Thin Solid Films, 163(1988) 415-420.
Appl. Phys. Lett. 42(5), 1 Mar. 1983, pp. 427-429.
Journal of Japan Crystal Growth Association vol. 13, No. 4, 1986, pp. 218-225.
Patent Abstracts of Japan vol. 015, No. 003 (E-1019) Jan. 1991 & JP-A-02 257 678 (Univ. Nagoya) Oct. 1990 Isambu.
Extended Abstracts vol. 87-2, Oct. 1987, Princeton, N.J., U.S. pp. 1602-1603 Nagatomo "Epitaxial growth of GaN films by low pressure . . . deposition" Patent Abstracts of Japan vol. 014, No. 263 (E-0938) Jun. 1990 & JP-A-02 081 483 (Manabe Katsushide) Mar. 1990.

*Primary Examiner*—Robert Kunemund
*Attorney, Agent, or Firm*—Nixon & Vanderhye

[57] ABSTRACT

Crystals of a gallium nitride-based compound semiconductor are grown on the surface of a buffer layer represented by formula $Ga_xAl_{1-x}N$ ($0 < X \leq 1$). The crystallinity of the gallium nitride-based compound semiconductor grown on the surface of the buffer layer can be drastically improved.

16 Claims, 8 Drawing Sheets

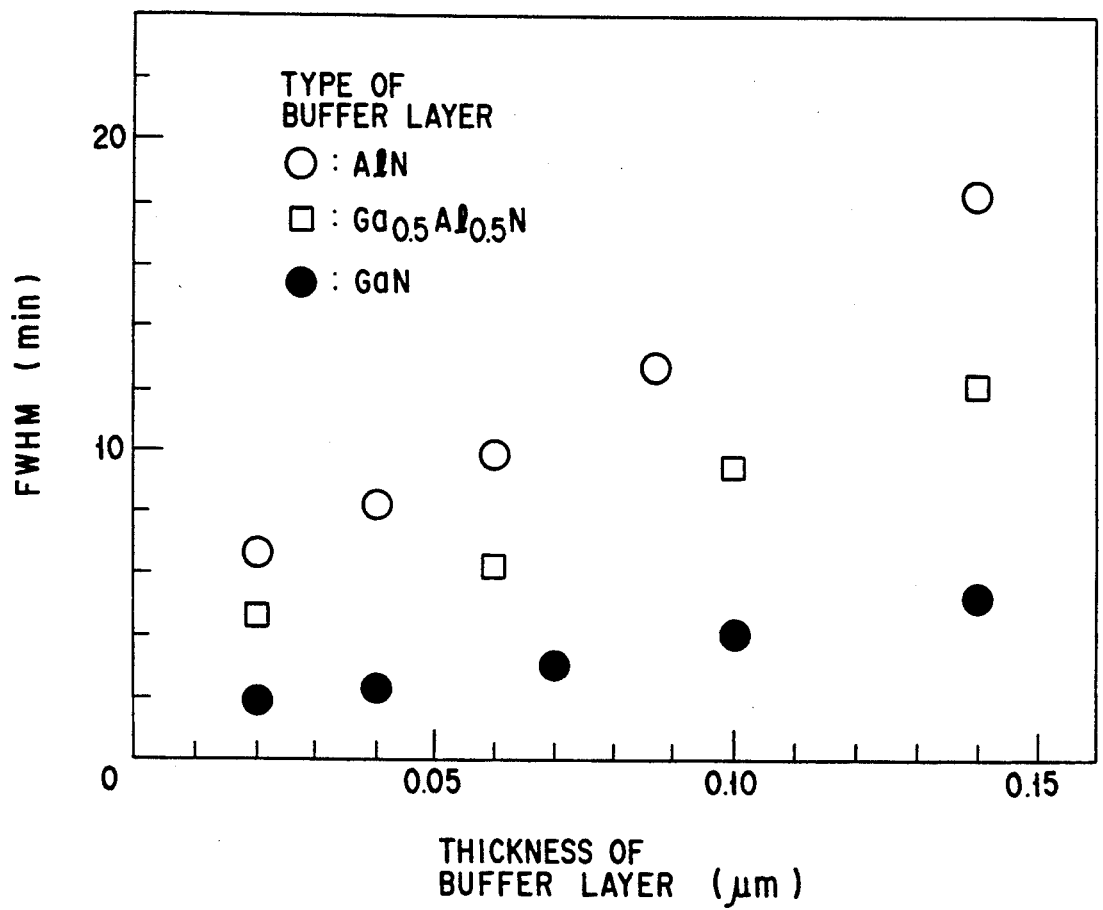
F I G. 3

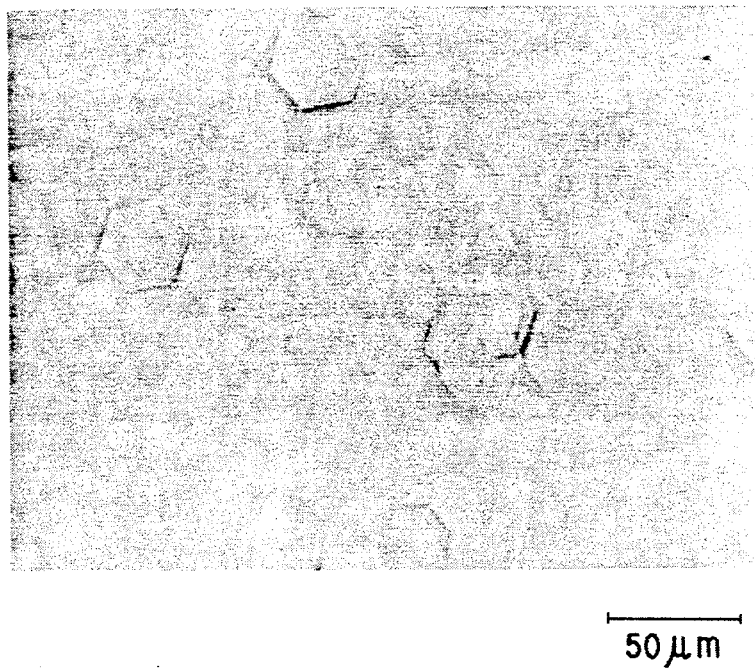
50 μm
F I G. 4
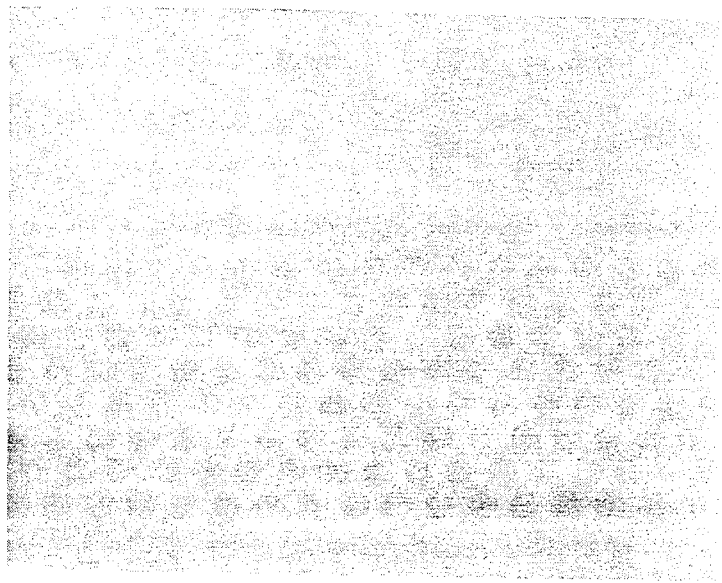
50 μm
F I G. 5

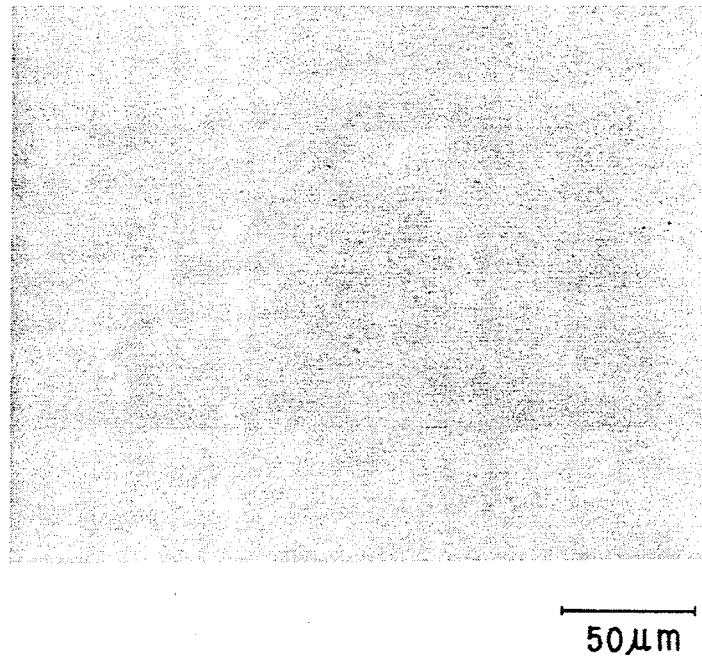
50μm
F I G. 6
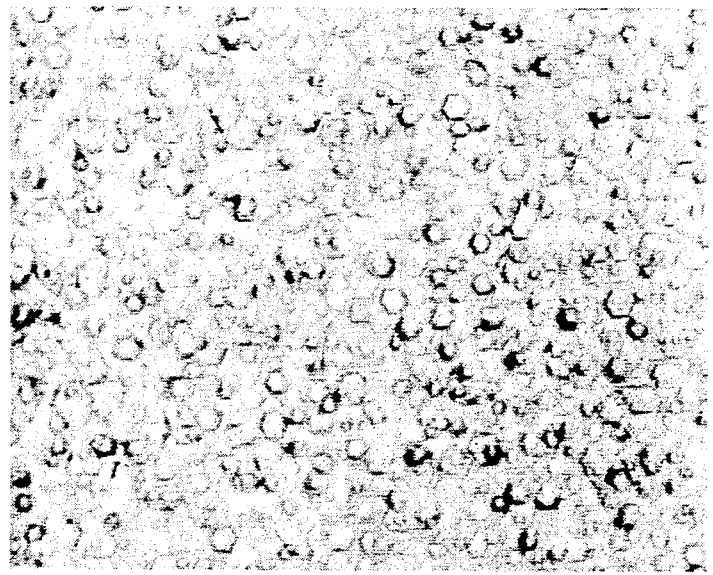
50μm
F I G. 7

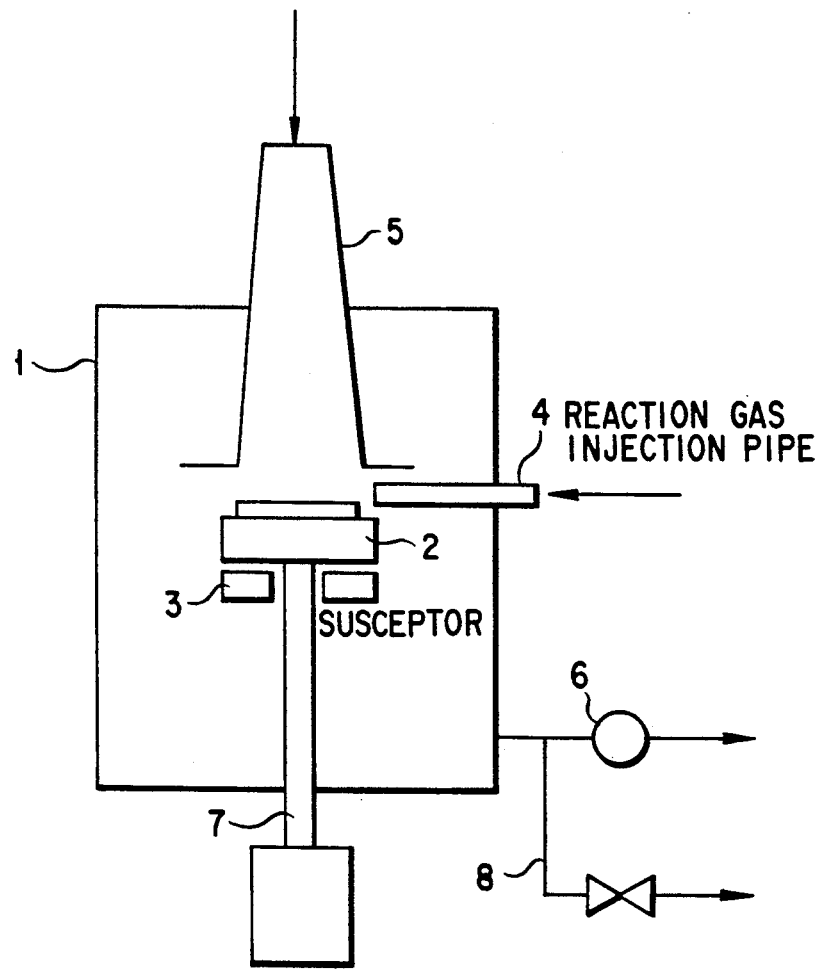
F I G. 8

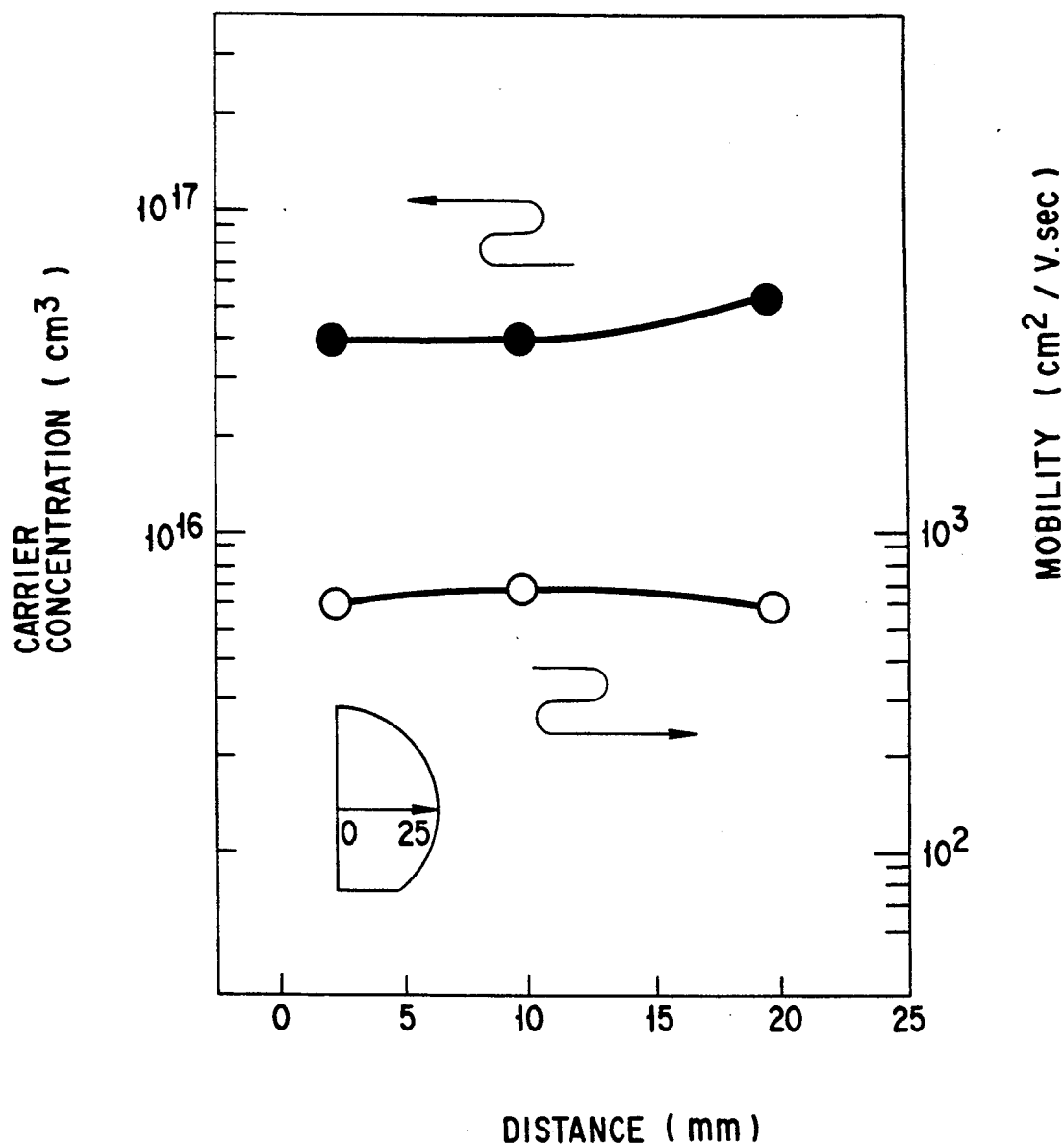
F I G. 9

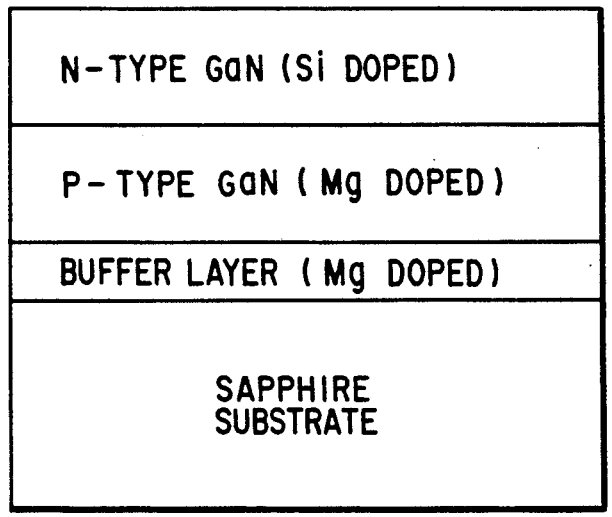
F I G. 11
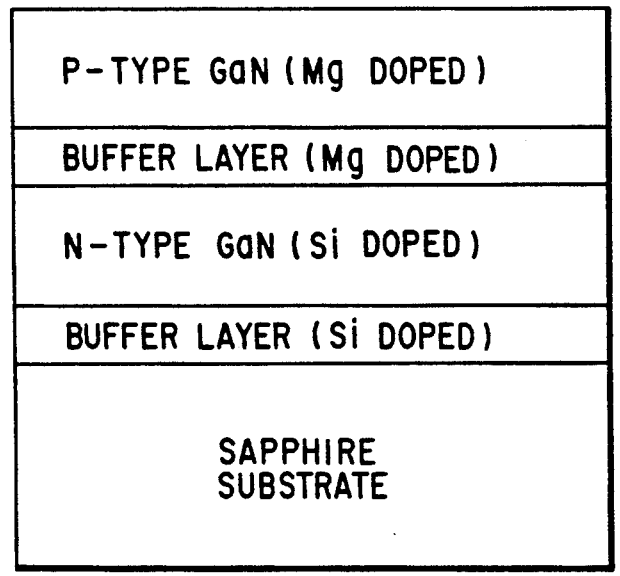
F I G. 12

CRYSTAL GROWTH METHOD FOR GALLIUM NITRIDE-BASED COMPOUND SEMICONDUCTOR

BACKGROUND OF THE INVENTION

1. Field of the Invention

The present invention relates to a method of growing crystals of a gallium nitride-based compound semiconductor on a substrate consisting of, e.g., sapphire and, more particularly, to a method of growing an epitaxial layer of a gallium nitride-based compound semiconductor with a high crystallinity.

2. Description of the Related Art

Recently, a blue light-emitting device using a gallium nitride-based compound semiconductor, e.g., a compound represented by formula $Ga_xAl_{1-x}N$ ($0 \leq X \leq 1$) has attracted attention.

Note that in the following description the compound represented by the above formula is called a gallium nitride-based compound even if X is 0.

As a method of growing crystals of such a gallium nitride-based compound semiconductor, a metalorganic chemical vapor deposition method (to be referred to as an MOCVD method hereinafter) is well known. In this method, an organometallic compound gas is supplied as a reaction gas into a reactor in which a sapphire substrate is placed, and the surface temperature of the substrate is held at a high temperature of 900° C. to 1,100° C., thereby growing an epitaxial layer of compound semiconductor on the substrate. For example, when a GaN epitaxial layer is to be grown, trimethylgallium gas and ammonia gas are used as a Ga-containing gas and an N-containing gas, respectively.

In order to use the grown epitaxial layer of a gallium nitride-based compound semiconductor as a light-emitting device, it is essential to improve the crystallinity of the layer first.

On the surface of the epitaxial layer of GaAlN, formed directly on the sapphire substrate using the MOCVD method, numerous projections and recesses are produced in the form of a hexagonal pyramid-like or hexagonal pillar-like growth pattern. For this reason, crystal surface morphology is very poor in the obtained crystal. Therefore, it is almost impossible to fabricate a blue light-emitting device using a semiconductor crystal layer having numerous projections and recesses on its surface and a very poor surface morphology because the yield is very low.

In order to solve the above problems, each of Appl. Phys. Lett 48, (1986), page 353 and Published Unexamined Japanese Patent Application No. 2-229476, for example, proposes a method of growing an AlN buffer layer on a substrate before growth of an epitaxial layer of a gallium nitride-based compound semiconductor. In this method, an AlN buffer layer with a film thickness of 100 to 500Å is formed on a sapphire substrate at a relatively low growth temperature of 400° C. to 900° C. According to this method, the crystallinity and the surface morphology of a GaAlN epitaxial layer can be improved to some extent by growing the GaAlN epitaxial layer on the AlN layer as a buffer layer.

In this method, however, it is necessary to strictly restrict the growth conditions of the buffer layer. In particular, the film thickness must be strictly set at a very small value of 100 to 500Å. In addition, it is difficult to uniformly form the buffer layer with a predetermined film thickness on the entire surface of a large-area sapphire substrate, e.g., a sapphire substrate about 50 mm in diameter. Therefore, it is difficult to improve the crystallinity and the surface morphology of a GaAlN epitaxial layer formed on the buffer layer with a high yield. Furthermore, the obtained crystallinity is still unsatisfactory to form a practical light-emitting diode or semiconductor laser, i.e., it requires further improvements.

In addition, this method cannot realize a p-n junction sufficient to put a light-emitting diode or the like into practical use. In general, when a light-emitting device is to be fabricated by forming a compound semiconductor layer on a substrate, doping a small amount of an impurity in the compound semiconductor to form an n- or p-type layer and in this manner obtain a p-n junction is known as a very effective means of improving the luminance of the device. However, no blue light-emitting device which realizes a sufficient luminance has been developed yet. The reason for this is that p conductivity type of a semiconductor crystal film cannot be formed.

It is difficult for conventional methods to form a p-type semiconductor crystal film even if p-type impurities such as Zn and Mg may be doped in a GaAlN epitaxial layer, because the crystal film has extremely bad crystallinity. For this reason, conventionally, n-type GaN is grown on a sapphire substrate by, e.g., Halide Vapor Phase Epitaxial (HVPE) crystal growth method, Zn diffusion is performed for the grown layer, and an I layer is formed to fabricate a blue light-emitting device with an MIS structure. However, a light-emitting device fabricated by this method cannot realize a satisfactory luminance efficiency.

In a recently reported technique, in order to form p conductivity type of a semiconductor crystal film, Mg is doped in GaN epitaxial layer, and then an electron beam is radiated on the GaN layer (Oyo Butsuri, 1991, Vol. 60, February, pp. 163 to 166). In this technique, the MOCVD method is used to form an AlN buffer layer with a thickness of 0.02 to 0.05 µm on a sapphire substrate at a low temperature (about 400° C. to 600° C.). Subsequently, the temperature is increased to 1,000° C. An Mg-doped GaN layer is then grown on the AlN buffer layer, and an electron beam is radiated on the surface to form a p-type Mg-doped GaN layer.

This method, however, is still far from a practical level. That is, the characteristics of the disclosed p-type GaN layer are only a maximum free hole concentration (carrier concentration) of $10^{17}/cm^3$ and a minimum resistivity of 12 Ω.cm.

SUMMARY OF THE INVENTION

The present invention has been made in consideration of the above situation and has as its object to provide a method which can grow a gallium nitride-based compound semiconductor having crystallinity and surface morphology at practical levels, with high stability and high yield while using a buffer layer.

It is another object of the present invention to provide a method which can grow a p- or n-type semiconductor layer at an excellent practical level so as to allow formation of an excellent p-n junction in a GaAlN for use in a light-emitting device.

According to the present invention, there is provided a crystal growth method for a gallium nitride-based compound semiconductor, comprising the steps of:

vapor-growing a buffer layer represented by formula Ga$_X$Al$_{1-X}$N (note that X falls within a range of $0 < X \leq 1$) on a substrate at a first temperature; and vapor-growing a gallium nitride-based compound semiconductor layer on the formed buffer layer at a second temperature higher than the first temperature.

According to the present invention, a buffer layer and/or gallium nitride-based compound semiconductor layer can be doped with an n- or p-type impurity on a substrate on the obtained buffer layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description give above and the detailed description of the preferred embodiments given below, serve to explain the principles of the invention.

FIG. 3 is a graph showing the relationship between the full width at half-maximum (FWHM) of the double-crystal rocking curve of a GaN epitaxial layer and the film thickness of a buffer layer FIG. 4 is a microphotograph showing the structure of crystals of a GaN epitaxial layer;

FIG. 5 is a microphotograph showing the structure of crystals of another GaN epitaxial layer;

FIG. 6 is a microphotograph showing the structure of crystals of still another GaN epitaxial layer;

FIG. 7 is a microphotograph showing the structure of crystals of still another GaN epitaxial layer;

FIG. 8 is a partial schematic sectional view showing an apparatus used in the present invention;

FIG. 9 is a graph showing the two-dimensional distributions of the carrier concentration and the mobility obtained by Hall measurement of GaN crystals according to the present invention;

FIG. 11 is a sectional view showing the structure of an embodiment of an element using a semiconductor crystal film according to the present invention; and FIG. 12 is a sectional view showing the structure of another embodiment of the element.

DETAILED DESCRIPTION OF THE PREFERRED EMBODIMENTS

The present invention will be described below. The present invention relates to a crystal growth method for a gallium nitride-based compound semiconductor, comprising the steps of:

forming a buffer layer represented by formula Ga$_X$Al$_{1-X}$N (note that X falls within a range of $0 < X \leq 1$) on a substrate at a first temperature; and forming an epitaxial layer of a gallium nitride-based compound on the formed buffer layer at a second temperature.

The surface layer preferably consists of a gallium nitride-based compound.

The thickness of the buffer layer is preferably 0.001 μm to 0.5 μm, and more preferably, 0.01 to 0.2 μm. If the thickness is smaller than 0.001 μm or larger than 0.5 μm, the surface morphology of the epitaxial layer gallium nitride-based compound formed on the buffer layer tends to be deteriorated.

The first temperature is adjusted to preferably 200° C. to 900° C., and more preferably, 400° C. to 800° C. If the temperature is lower than 200° C., it becomes difficult to form the buffer layer. If the temperature is higher than 900° C., the buffer layer becomes monocrystalline and therefore no longer performs functions as a buffer layer.

The epitaxial layer of the gallium nitride-based compound formed on the buffer layer are preferably represented by formula Ga$_X$Al$_{1-X}$N (note that X falls within the range of $0 < X \leq 1$).

Figure 1:
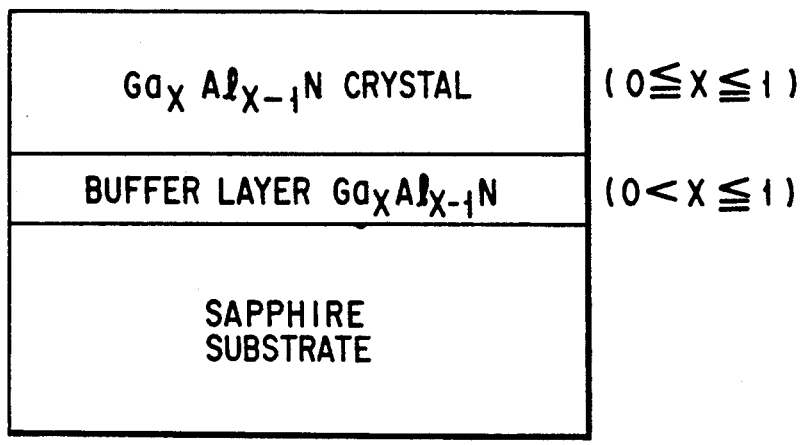
FIG. 1 is a schematic sectional view showing the structure of an epitaxial wafer according to the crystal growth method of the present invention.
Figure 2:
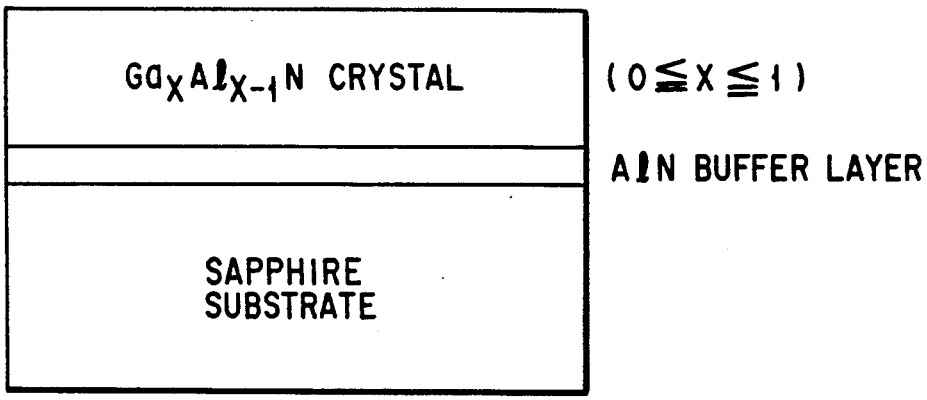
FIG. 2 is a schematic sectional view showing the structure of an epitaxial wafer according to a conventional crystal growth method.

FIG. 1 is a sectional view showing the structure of an epitaxial wafer obtained when a gallium nitride-based semiconductor layer are grown on a buffer layer consisting of Ga$_X$Al$_{1-X}$N ($0 < X \leq 1$). FIG. 2 is a sectional view showing the structure of wafer obtained when a gallium nitride-based semiconductor layer is grown on an AlN buffer layer.

The allowable thickness range of the buffer layer of the present invention is wider than those of conventional buffer layers. For this reason, it is possible to grow the buffer layer and the gallium nitride-based compound semiconductor layer with high yield.

A method of growing a gallium nitride-based compound semiconductor layer using AlN as a buffer layer is described in detail in, e.g., Thin Solid Films, 163, (1988), page 415, or Appl. Phys. Lett. 48, (1986), page 353. The effects of the buffer layer described in these references will be briefly described below.

AlN which is grown at a low temperature (about 600° C.) is a polycrystalline layer. When the temperature of a substrate on which this AlN polycrystalline layer is formed is increased to about 1,000° C. in order to form, e.g., GaN, this polycrystalline layer partially becomes monocrystalline. The monocrystalline portion serves as a seed crystal with an uniform orientation. When GaN epitaxial layer is grown at 1,000° C., GaN epitaxial layer is grown from this seed crystal to make it possible to grow an uniform GaN epitaxial layer. If no buffer layer is used, the sapphire substrate itself serves as a seed crystal. Since, in this case every surface portions of the sapphire substrate serve as a seed crystal, there is a large variation in crystal orientations of GaN hexagonal pillars grown on the sapphire substrate.

By comparing the case in which Ga$_X$Al$_{1-X}$N ($0 < X \leq 1$) is formed as a buffer layer as in the present invention with the case in which conventional AlN is used as the buffer layer, the following assumption can be made.

First, suppose that GaN of, e.g., X=1 is formed as the buffer layer. In this case, the melting point of GaN is 1,100° C. and the melting point of AlN is 1,700° C. When a buffer layer of GaN is formed at 600° C., a polycrystalline layer results. Subsequently, when the temperature of the substrate is increased to 1,000° C. in order to grow a GaN epitaxial layer on this polycrystalline GaN layer, the GaN buffer layer partially becomes monocrystalline. As in the case wherein AlN is used as a buffer layer, this monocrystalline portion serves as a seed crystal for a GaN epitaxial layer.

It is assumed that the following advantages can be obtained by the present invention compared with the case in which the AlN buffer layer is formed.

First, since the melting point is low, conversion into single-crystals easily occurs during the rise of the temperature. Therefore, the effects as a buffer layer can be expected even when the thickness of the buffer layer is increased.

Secondary, the buffer layer consists of GaN. As a result, an improvement in crystallinity can be expected when the GaN epitaxial layer is grown on the buffer layer because the epitaxial layer is formed on the layer of the same material.

To confirm the above advantages, three types of buffer layers consisting of AlN, $Ga_{0.5}Al_{0.5}N$, and GaN were independently formed on sapphire substrates at 600° C., and a 4-μm thick GaN epitaxial layer was grown on each of the formed layers at 1,000° C. A measurement was made for the full width at half-maximum (FWHM) of the double-crystal X-ray rocking curve of each GaN epitaxial layer. FIG. 3 is a graph showing the relationship between the FWHM and the film thickness of the buffer layer. In FIG. 3, the smaller the FWHM is, the better the crystallinity.

As shown in FIG. 3, it was found that when GaN was formed as the buffer layer, a better crystallinity could be obtained over a wide film thickness range of the buffer layer, and that the effect of $Ga_{0.5}Al_{0.5}N$ was intermediate of the three cases. This indicates that the advantages assumed above are correct.

FIGS. 4 to 7 are microphotographs showing the structures of the surfaces of GaN epitaxial layers obtained when GaN buffer layers having different film thicknesses were formed on sapphire substrates and 4-μm thick GaN epitaxial layer were grown on the respective buffer layers. The thicknesses of the buffer layers shown in FIGS. 4 to 7 are 0.002 μm, 0.07 μm, 0.20 μm, and 0 μm (no buffer layer) in this order.

As can be seen from these drawings, hexagonal crystal pillars appear on the surface when no buffer layer is formed. Although it depends on the formation conditions of the buffer layer, the surface of the buffer layer tends to have a mirror surface uniformity as the formation of the buffer layer advances. However, when the buffer layer is too thick, the surface state (surface morphology) is deteriorated. A preferable thickness of the buffer layer is, therefore, 0.01 μm to 0.2 μm.

The temperature at which an epitaxial layer of the gallium nitride-based compound are formed on the buffer layer is preferably 900° C. to 1150° C. If the temperature is less than 900° C., gallium nitride-based compound is tend to become polycrystalline. If the temperature exceeds 1150° C., gallium nitride crystals is tend to decomposed during growing.

The buffer layer according to the crystal growth method of the present invention can be formed not only on a sapphire substrate but also on any layer as long as the layer has an epitaxial layer of a gallium nitride-based compound semiconductor. Thus, according to the present invention the gallium nitride-based compound semiconductor can form a multi layer structure such as buffer/epitaxial/buffer/epitaxial structure and buffer/epitaxial/epitaxial/buffer/epitaxial structure.

For example, when it is desired to form a p-type GaN epitaxial layer doped with Mg as a p-type impurity on an n-type GaN epitaxial layer, it is also possible to form a buffer layer on the n-type GaN epitaxial layer and to form the p-type GaN epitaxial layer on the buffer layer.

According to the present invention, a buffer layer and/or an epitaxial layer of a gallium nitride-based compound formed on the buffer layer can be doped with an n- or p-type impurity.

More specifically, this growth method of the present invention is a method of supplying a reaction gas into a reactor to grow an epitaxial layer consisting of an n- or p-type gallium nitride compound. The characteristic feature of this method is that before the growth of the epitaxial layer, an n- or p-type impurity is doped in a buffer layer preferably represented by formula $Ga_xAl_{1-x}N$ ($0 < X \leq 1$) to grow a polycrystalline layer at a first temperature of about 200° C. to about 900° C., and then an n- or p-type impurity is doped in the surface of the buffer layer at a second temperature of about 900° C. to about 1150° C. or more to grow an epitaxial layer of a gallium nitride-based compound.

As the impurity to be doped in the gallium nitride-based compound to impart n conductivity type to it, it is possible to use, for example, Si and Sn. Examples of the impurity for imparting n conductivity type to the gallium nitride-based compound are Zn, Mg, Ca, and Be. In the growth method of the present invention, the impurity for imparting n or p conductivity type to the gallium nitride-based compound is not particularly limited. In the method of the present invention, it is possible to dope any impurity which is presently, already used or may be developed in the future in order to impart p or n conductivity type to the gallium nitride-based compound semiconductor.

The concentration of the impurity to be doped in the semiconductor crystal film is preferably as large as possible because the resistance of a semiconductor crystal film decreases when an impurity is heavily doped in it. A concentration at which the impurity can be doped without deteriorating the crystallinity of the epitaxial layer is preferably $10^{17}$ to $10^{20}$ $cm^3$.

The thickness of the buffer layer is preferably 0.001 to 0.5 μm, and more preferably, 0.02 to 0.2 μm. If the thickness is less than 0.001 μm or more than 0.5 μm, the surface state and the crystallinity of the epitaxial layer of the n- or p-type gallium nitride-based compound formed on the surface of the buffer layer tend to deteriorate. For example, hexagonal crystal pillars appear on the surface of the semiconductor crystal film when no buffer layer is present. The crystal surface tends to have a mirror surface uniformity as the formation of a buffer layer proceeds though it depends on the formation conditions of the buffer layer. However, if the buffer layer is too thick, the surface state and the crystallinity of the semiconductor crystal film again tend to deteriorate.

According to the crystal growth method of the present invention, it is possible to form an epitaxial layer of a p-type gallium nitride-based compound the surface of a buffer layer doped with, e.g., a p-type impurity and to radiate an electron beam onto this epitaxial layer. The p-type gallium nitride-based compound semiconductor manufactured by this method has a large electron-beam radiating effect and can provide a particularly excellent p-type epitaxial layer as compared with a p-type epitaxial layer stacked on a buffer layer not doped with any p-type impurity.

According to the growth method of the present invention, a p-type GaN epitaxial layer can be grown through the following steps.

First, an Mg-doped polycrystalline buffer layer is grown at a low temperature of 200° C. to 900° C. Subsequently, in order to grow an epitaxial layer of Mg-doped p-type GaN on the surface of the buffer layer, the temperature is raised to about 1,000° C. At this time, the buffer layer partially becomes monocrystalline to form a seed crystal for growing p-type GaN.

The manner of this conversion into single crystals will be described in more detail below. During the temperature rise to 1,000° C., Mg in the buffer layer causes rearrangement to a Ga lattice site to facilitate its entrance into the Ga site. Therefore, when the temperature is raised to 1,000° C. and the Mg-doped p-type GaN epitaxial layer is grown, the buffer layer in which Mg enters the Ga site serves as a seed crystal to make it easier for Mg to enter a Ga site in the p-type GaN epitaxial layer to be grown on the surface of the buffer layer.

As described above, doping Mg in the buffer layer facilitates formation of an epitaxial layer of a p-type gallium nitride-based compound, which is difficult to perform in conventional methods.

The gallium nitride-based compound semiconductor epitaxial layer has a property to acquire n conductivity type without being doped with an impurity such as Si. For this reason, it is not always necessary to dope Si in the semiconductor crystal film in order to impart n conductivity type to the gallium nitride-based compound semiconductor. However, when a gallium nitride-based compound semiconductor is grown on the surface of a buffer layer doped with an n-type impurity, an n-type epitaxial layer having more preferable characteristics can be formed.

FIGS. 11 and 12 are sectional views showing the structures of light-emitting diodes of an embodiment according to the present invention. A illustrated in the embodiment of FIGS. 11 and 12, a buffer layer doped with an impurity may be formed not only on the sapphire substrate but also on any layer. Suitable substrates in addition to sapphire include Si, SiC and GaAs.

The reaction gas used in the present invention preferably contains at least one material selected from the group consisting of trimethylgallium, trimethylaluminum and triethyl aluminum. This reaction gas also preferably contains at least one material selected from the group consisting of ammonia gas and hydrazine. This reaction gas also more preferably contains at least one gas selected from the group consisting of trimethylindium, cyclopentadienyl-magnesium, diethyzinc, and trimethylzinc.

The substrate is selected from the group consisting of sapphire, Si, SiC, GaP, InP and GaAs.

Examples of the present invention will be described below. However, the following Examples merely exemplify the method of practicing the technical concept of the present invention. Therefore, the method of the present invention is not particularly limited to the Examples below in terms of, e.g., the growth conditions, the type of an organometallic compound gas, and the materials used. Various modifications can be made for the growth method of the present invention in accordance with the scope of claims.

An apparatus shown in FIG. 8 was used to perform crystal growth of a gallium nitride-based compound semiconductor.

EXAMPLE 1

A GaN epitaxial layer was grown to have a film thickness of 4 $\mu$m on a sapphire substrate in accordance with the following steps.

(1) A washed sapphire substrate having a diameter of 2 inches was placed on a susceptor 2.

(2) The air in a stainless steel reactor 1 was sufficiently exhausted by an exhaust pump 6, and $H_2$ gas was introduced into the reactor 1, thus replacing the air in the reactor with $H_2$ gas.

(3) thereafter, the susceptor 2 was heated up to 1,060° C. by a heater 3 while supplying $H_2$ gas into the reactor 1 from a reaction gas injection pipe 4 and an injection subpipe 5 in the upper portion of the reactor 1.

(4) This state was held for 10 minutes to remove an oxide film from the surface of the sapphire substrate.

(5) The temperature of the susceptor 2 was then decreased to 500° C., and the substrate was left to stand until the temperature became stable.

(6) Subsequently, a gas mixture of $H_2$ and $N_2$ was supplied from the injection subpipe 5, and a gas mixture of ammonia gas and $H_2$ gas was supplied from the reaction gas injection pipe 4. The flow rate of each of the $H_2$ and $N_2$ gases supplied from the injection subpipe 5 was 10 l/min, and the flow rates of the ammonia gas and the $H_2$ gas supplied from the reaction gas injection pipe 4 were 4 l/min and 1 l/min, respectively. This state was maintained until the temperature of the susceptor 2 was stabilized at 500° C.

(7) Thereafter, in order to form a buffer layer, TMG (trimethylgallium) gas was flowed at a flow rate of $2.7 \times 10^{-5}$ mol/min for one minute in addition to the ammonia and $H_2$ gases from the reaction gas injection pipe 4.

(8) Subsequently, only the TMG gas was stopped to stop the growth of the buffer layer. The result was a 0.02-$\mu$m thick buffer layer. The temperature of the susceptor 2 was increased to 1,020° C. while flowing the other gases.

(9) After the temperature of the susceptor 2 was raised to 1,020° C., TMG gas was flowed at a flow rate of $5.4 \times 10^{-5}$ mol/min for 60 minutes in addition to the ammonia and $H_2$ gases from the reaction gas injection pipe 4, thereby growing a GaN epitaxial layer to have a film thickness of 4.0 $\mu$m.

During the growth, the $H_2$ and $N_2$ gases were constantly supplied from the injection subpipe 5 under the conditions described above so that the interior of the reactor was not contaminated with the reaction gas. In addition, the susceptor 2 was rotated at a rate of 5 rpm by a motor 7 so as to uniformly grow crystals. Note that while the gases were supplied, the supplied gases were exhausted outside from an exhaust pipe 8 branched from piping of the exhaust pump 6.

In this manner, the 0.02-$\mu$m thick GaN buffer layer and the 4-$\mu$m thick GaN epitaxial layer were grown on the sapphire substrate. Control 1

A 4-$\mu$m thick GaN epitaxial layer was grown on an AlN buffer layer following the same procedures as in Example 1 except that the AlN buffer layer was formed to have a film thickness of 0.02 $\mu$m in the step (7) of forming the buffer layer.

In the formation of the AlN buffer layer, TMA (trimethylaluminum) was flowed at a flow rate of $2.7 \times 10^{-5}$ mol/min in addition to ammonia and H$_2$ gases from the reaction gas injection pipe 4 in the step (7).

Figure 10:
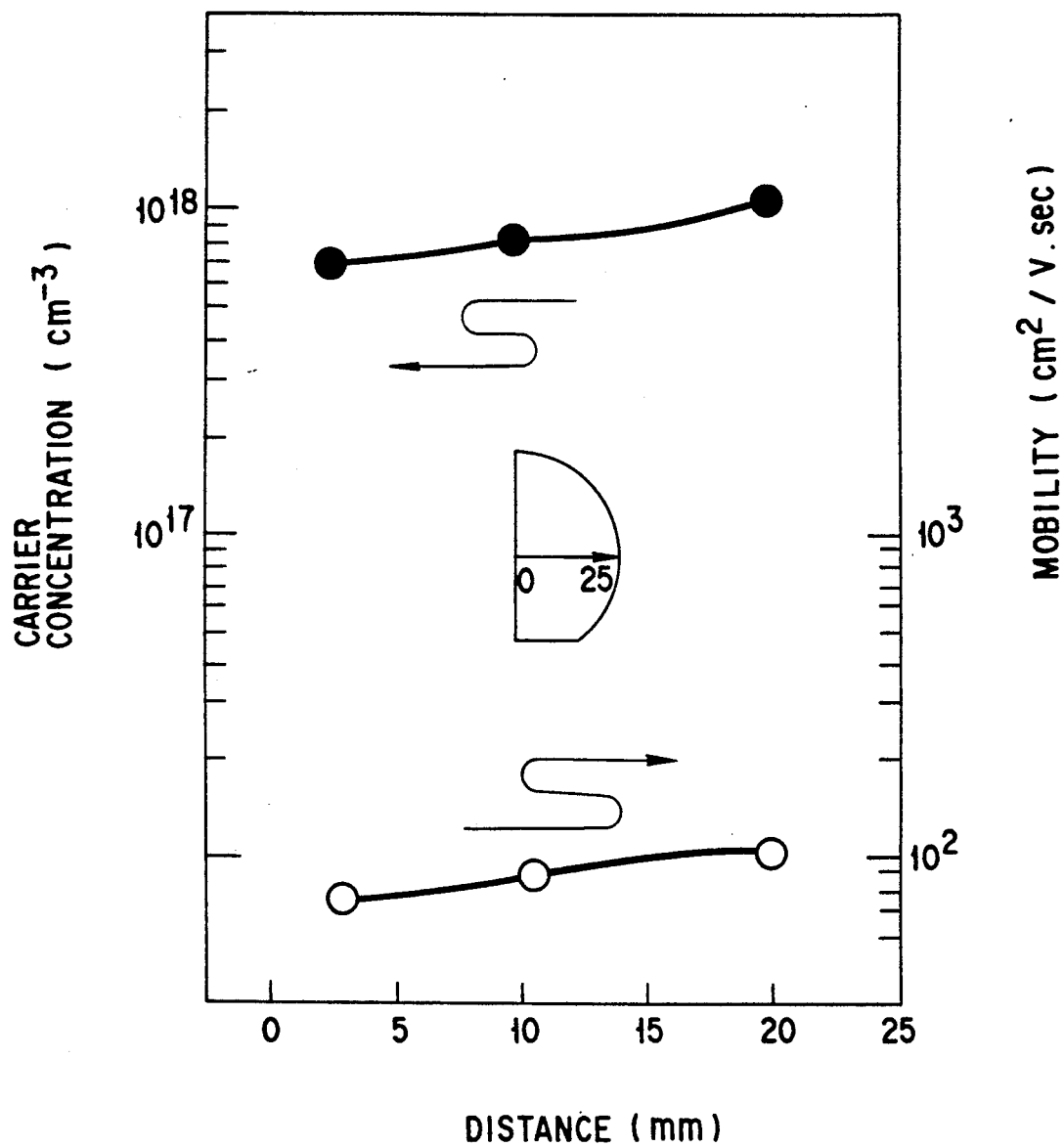
FIG. 10 is a graph showing the two-dimensional distributions of the carrier concentration and the mobility obtained by Hall measurement of conventional GaN crystals.

After the growth, a Hall measurement was performed at room temperature to obtain the carrier concentration and the mobility of the GaN epitaxial layer according to the present invention and those of the GaN epitaxial layer of Control 1. Each of FIGS. 9 and 10 shows the two-dimensional distributions of the carrier concentration and the mobility. The results of the present invention are shown in FIG. 9, and those of the control are shown in FIG. 10, in which the carrier concentration is represented by , and the mobility is represented by o.

Referring to FIGS. 9 and 10, in the case of growth of nondoped crystals, as the carrier concentration decreases and the impurity concentration is decreased.

As is apparent from FIG. 9, the GaN according to the present invention exhibits very good values: a carrier concentration of $4 \times 10^{16}$/cm$^3$ and a mobility of about 600 cm$^2$/V.sec.

As is apparent from FIG. 10, GaN of Comparative Example 1 using AlN as the buffer layer exhibited a carrier concentration of $1 \times 10^{18}$/cm$^3$ and a mobility of about 90 cm$^2$/V.sec.

EXAMPLE 2

A GaN epitaxial layer was grown on a Ga$_{0.5}$Al$_{0.5}$N buffer layer following the same procedures as in Example 1 except that the buffer layer was formed to have a film thickness of 0.02 μm in the step (7) of forming the buffer layer.

In the formation of the buffer layer, TMG and TMA were flowed at flow rates of $2.7 \times 10^{-5}$ mol/min and $2.7 \times 10^{-5}$ mol/min, respectively, for 0.5 minutes each in addition to ammonia and H$_2$ gases from the reaction gas injection pipe 4.

As shown in FIG. 3, this GaN epitaxial layer also had an excellent X-ray rocking curve. In addition, the surface morphology of the layer obtained by microscopic observation was equivalent to that of Example 1, and its carrier concentration and mobility were intermediate between those of Example 1 and Control 1.

EXAMPLE 3

A gallium nitride epitaxial layer was grown following the same procedures as in Example 1 except that the growth temperature of a buffer layer was set at 600° C. in the step (6) and the gas flow time was changed to 2.5 minutes in the step (7) so that the buffer layer was formed to have a film thickness of 0.05 μm.

The surface morphology of this gallium nitride epitaxial layer was equivalent to that of Example 1, and the full-width at half maximum of its X-ray rocking curve was three minutes, indicating good crystallinity. In addition, both of the carrier concentration and the mobility of the layer were equivalent to those of Example 1.

EXAMPLE 4

A gallium nitride epitaxial layer was grown following the same procedures a in Example 1 except that the growth temperature of a buffer layer was set at 800° C. in the step (6).

The surface morphology of this GaN epitaxial layer was equivalent to that of Example 1, and the full-width at half maximum of its X-ray rocking curve was three minutes, indicating good crystallinity. In addition, both of the carrier concentration and the mobility of the layer were equivalent to those of Example 1.

EXAMPLE 5

A 0.02-μm thick Ga$_{0.5}$Al$_{0.5}$N buffer layer was formed on a sapphire substrate according to Example 2 and a 4-μm thick Ga$_{0.5}$Al$_{0.5}$N epitaxial layer was grown on the buffer layer following the same procedures as in Example 1 except that in the step (9), TMA gas and TMG gas were supplied at flow rates of $2.7 \times 10^{-5}$ mol/min and $2.7 \times 10^{-5}$ mol/min, respectively, for 60 minutes in addition to ammonia and H$_2$ gases from the reaction gas injection pipe 4.

The surface morphology of this 4-μm thick Ga$_{0.5}$Al$_{0.5}$N epitaxial layer was equivalent to that of Example 1.

EXAMPLE 6

In the step (9), Mg as a p-type impurity was doped in a GaN epitaxial layer while Cp$_2$Mg (biscyclopentadienylmagnesium) gas was flowed in addition to ammonia gas, H$_2$ gas, and TMG gas, thereby growing a p-type GaN epitaxial layer to have a film thickness of 4.0 μm.

In the manner described above, a 0.02-μm thick GaN buffer layer was formed on a sapphire substrate, and the 4.0-μm thick p-type GaN epitaxial layer doped with $10^{20}$/cm$^3$ of Mg was grown on the buffer layer.

This p-type GaN epitaxial layer also had a surface morphology equivalent to that of Example 1. In addition, the layer had a hole carrier concentration of $2.0 \times 10^{15}$/cm$^3$ and a mobility of 9.4 cm$^2$/V.sec, i.e., exhibited p-type characteristics for the first time as a gallium nitride-based compound semiconductor. This indicates that the crystallinity of this epitaxial film is very good.

EXAMPLE 7

Following the same procedures as in Example 6, a 0.02-μm thick GaN buffer layer was formed on the 4-μm thick GaN epitaxial layer obtained by the same procedure as in Example 1, and a 4.0-μm thick p-type GaN epitaxial layer doped with $10^{20}$/cm$^3$ of Mg was grown on the buffer layer.

This p-type epitaxial layer also had a surface morphology equivalent to that in Example 1 and had a carrier concentration of $3.5 \times 10^{15}$/cm$^3$ and a mobility of 8.5 cm$^2$/V.sec, i.e., similarly exhibited p-type characteristics.

EXAMPLE 8

In the step (9), Si as an n-type impurity was doped in a GaN epitaxial layer while silane (SiH$_4$) gas was flowed in addition to ammonia gas, H$_2$ gas, and TMG gas, thereby growing the layer to have a film thickness of 4.0 μm.

In the manner described above, a 0.02-μm thick GaN buffer layer was formed on a sapphire substrate, and the 4-μm thick n-type GaN epitaxial layer doped with about $10^{20}$/cm$^3$ of Si was grown on the buffer layer.

This n-type GaN epitaxial layer also had a surface morphology equivalent to that in Example 1 and exhibited a very high carrier concentration of $1.0 \times 10^{19}$/cm$^3$

Control 2

An AlN buffer layer was formed on a sapphire substrate by doping Si following the same procedures as in Example 8 except that the buffer layer was formed to have a film thickness of 0.02 μm, and a 4-μm thick n-type GaN epitaxial layer was formed on the buffer layer.

The carrier concentration of this n-type GaN epitaxial layer was $5.0 \times 10^{18}/cm^3$, i.e., low compared to Control 1. It is assumed that this low carrier concentration was caused by compensation by the impurity.

EXAMPLE 9

In the step (7), in order to form a buffer layer, TMG (trimethylgallium) gas and Cp$_2$Mg (biscyclopentadienylmagnesium) gas were flowed in addition to ammonia gas and H$_2$ gas from the reaction gas injection pipe 4, thereby forming a 0.04-μm thick buffer layer.

In the step (9), after the temperature of the susceptor rose to 1,000° C., TMG gas and Cp$_2$Mg gas were supplied in addition to the ammonia and H$_2$ gases from the reaction gas injection pipe 4, thereby growing a p-type GaN epitaxial layer to have a film thickness of 4.0 μm.

In the manner described above, the 0.04-μm thick GaN buffer layer doped with Mg as a p-type impurity was formed on a sapphire substrate, and the 4-μm thick p-type GaN epitaxial layer doped with Mg was grown on the buffer layer. Note that the doping amount of Mg was $10^{20}cm^3$ in both the buffer and p-type epitaxial layers.

Thereafter, a Hall measurement was performed for this p-type GaN epitaxial layer. The results were a carrier concentration of $4.5 \times 10^{17}/cm^3$, a resistivity of 1.0 Ω.cm, and a Hall mobility of 9.0 cm$^2$/V.sec.

EXAMPLE 10

An electron beam irradiation treatment was performed under the condition that acceleration voltage was maintained at 5 kV on the entire surface of the p-type GaN epitaxial layer obtained in Example 9, thus further imparting p conductivity type to a layer with a thickness of about 0.2 μm from the surface.

The obtained p-type GaN epitaxial layer was subjected to a Hall measurement. As a result, in the layer 0.2 μm thick from the surface, the carrier concentration, the resistivity, and the Hall mobility were improved to $4.6 \times 10^{18}/cm^3$, 0.3 Ω.cm, and 11.0 cm$^2$/V.sec, respectively.

Control 3

A buffer layer and a p-type GaN epitaxial layer doped with $10^{20}/cm^3$ of Mg were grown to have thicknesses of 0.04 μm and 4 μm, respectively, following the same procedures as in Example 9 except that no Mg was doped in the buffer layer. Thereafter, following the same procedures as in Example 10, an electron beam radiation was performed to further impart p conductivity type to a layer with a thickness of about 0.2 μm from the surface.

The results of Hall measurement were a carrier concentration of $3 \times 10^{17}/cm^3$, a resistivity of 2 Ω.cm, and a Hall mobility of 10 cm$^2$/V.sec in the layer 0.2 μm thick from the surface.

As described above, forming Ga$_X$Al$_{1-X}$N ($0 < X \leq 1$) as a buffer layer drastically improves the crystallinity of an epitaxial layer a gallium nitride-based compound grown on the buffer layer. For example, in a Hall measurement of crystals, a mobility of 600 cm$^2$/V.sec is the most excellent value of the epitaxial layer.

In addition, since the buffer layer is formed, the Mg-doped GaN epitaxial layer grown on the buffer layer exhibits p conductivity type without performing any treatment. This is the phenomenon never encountered in conventional techniques, which indicates that the crystallinity of the epitaxial layer of the gallium nitride-based compound semiconductor grown by the method of the present invention is very excellent. Also, Si-doped n-type GaN grown on the buffer layer has a carrier concentration much higher than that of GaN using AlN as a buffer layer.

Furthermore, the conditions under which the buffer layer of the present invention is to be grown are less severe than those for a conventional AlN buffer layer. That is, the crystallinity of an epitaxial layer gallium nitride-based compound grown on a buffer layer is good over a wide range of buffer layer thickness. This results in high productivity in the manufacture of light-emitting devices.

In addition, since doping an n- or p-type impurity in a buffer layer grown at a low temperature improves the conductivity characteristics of an n- or p-type gallium nitride-based compound semiconductor epitaxial layer to be subsequently grown on the buffer layer, a p-n junction can be easily formed. Table 1 below indicates how good the characteristics of the p-type epitaxial layer of the gallium nitride-based compound are.

TABLE 1

|  | Hole Carrier Concentration number/cm$^3$ | Resistivity (Ω · cm) | Hall mobility cm$^3$/V · sec |
|---|---|---|---|
| Example 9 | $4.5 \times 10^{17}$ | 1.0 | 9.0 |
| Example 10 | $4.6 \times 10^{18}$ | 0.2 | 11.0 |
| Comparative Example 3 | $3 \times 10^{17}$ | 2 | 10.0 |

As shown in Table 1, in the case of a p-type GaN epitaxial layer, the carrier concentration and the resistivity of the layer respectively reach practical levels to improve the performance of the layer to be 100 times or more that of the conventional example. Especially when an electron beam is radiated onto a p-type GaN epitaxial layer grown by the crystal growth method of the present invention, the carrier concentration of the layer is improved to be nearly 1,000 times.

As has been described above, the use of the technique of the present invention makes it possible to utilize crystals of an epitaxial layer of a gallium nitride-based compound over a wide range of applications from a blue light-emitting diode to a semiconductor laser at practical levels.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A crystal growth method for a gallium nitride-based compound semiconductor, comprising the steps of:
    vapor-growing a buffer layer represented by the formula Ga$_X$Al$_{1-x}$N ($0 > X \leq 1$) having a thickness of 0.001–0.5 μm on a substrate at a first temperature of 200° C. to 900° C.; and vapor-growing a semiconductor layer represented by the same formula on said formed buffer layer at a second temperature ranging from 900° to 1150° C.

2. A method according to claim 1, further comprising the steps of:

vapor-growing a second buffer layer represented by formula $Ga_xAl_{1-x}N$ $(0>X\leq 1)$ on said gallium nitride-based compound semiconductor layer at a third temperature lower than the second temperature; and vapor growing a semiconductor layer represented by the formula $Ga_xAl_{1-x}N$ $(0<X<1)$ on said second buffer layer at a fourth temperature higher than the third temperature.

3. A method according to claim 1, further comprising the step of doping an n- or p-type impurity in said buffer layer.

4. A method according to claim 3, wherein said n-type impurity is at least one material selected from the group consisting of Si and Sn.

5. A method according to claim 3, wherein said p-type impurity is at least one material selected from the group consisting of Zn, Mg, Ca, and Be.

6. A method according to claim 3, wherein the doping amount of said n- or p-type impurity is $10^{17}$ to $10^{20}/cm^3$.

7. A method according to claim 1, further comprising the step of doping an n- or p-type impurity in said semiconductor layer.

8. A method according to claim 7, wherein said n-type impurity is at least one material selected from the group consisting of Si and Sn.

9. A method according to claim 7, wherein said p-type impurity is at least one material selected from the group consisting of Zn, Mg, Ca, and Be.

10. A method according to claim 7, wherein the doping amount of said n- or p-type impurity is $10^{17}$ to $10^{20}/cm^3$.

11. A method according to claim 1, wherein said buffer layer is grown using a reaction gas containing at least one gas selected from the group consisting of trimethyl gallium and triethylgallium, and at least one gas selected from the group consisting of ammonia gas and hydrazine.

12. A method according to claim 11, wherein said reaction gas contains trimethylaluminum.

13. A method according to claim 11, wherein said reaction gas contains at least one gas selected from the group consisting of cyclopentadienylmagnesium, diethylzinc, and trimethylzinc.

14. A method according to claim 1, wherein said substrate comprises one material selected from the group consisting of sapphire, Si, SiC and GaAs.

15. A method according to claim 9, further comprising, after the formation of said semiconductor layer, the step of radiating an electron beam onto the formed semiconductor layer.

16. The method according to claim 1, further comprising the additional steps of:

vapor-growing a second buffer layer represented by the formula $Ga_xAl_{1-x}N$ $(0<X\leq 1)$ on said gallium nitride-based compound semiconductor layer at a third temperature lower than said second temperature; and vapor-growing a semiconductor layer represented by the same formula on said second buffer layer at a fourth temperature higher than said third temperature.

* * * * *

UNITED STATES PATENT AND TRADEMARK OFFICE
CERTIFICATE OF CORRECTION

PATENT NO. : 5,290,393
DATED : March 1, 1994
INVENTOR(S) : NAKAMURA

It is certified that error appears in the above-indentified patent and that said Letters Patent is hereby corrected as shown below:

On the title page:

Item [30]  foreign patent documents, delete reference to "Japanese application 3-089841". Priority not claimed from Japanese application 3-089841.

Signed and Sealed this

Twenty-sixth Day of July, 1994

Attest:

BRUCE LEHMAN

*Attesting Officer*       *Commissioner of Patents and Trademarks*